(12) United States Patent
Darwhekar et al.

(10) Patent No.: US 9,954,705 B2
(45) Date of Patent: Apr. 24, 2018

(54) PHASE NOISE IMPROVEMENT TECHNIQUES FOR WIDEBAND FRACTIONAL-N SYNTHESIZERS

(71) Applicant: Texas Instruments Incorporated, Dallas, TX (US)

(72) Inventors: Yogesh Darwhekar, Bangalore (IN); Srikanth Manian, Bangalore (IN); Srinivas Theertham, Bangalore (IN); Jagdish Chand Goyal, Bangalore (IN); Robert Karl Butler, Issaquah, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/388,407

(22) Filed: Dec. 22, 2016

(65) Prior Publication Data

US 2017/0187515 A1   Jun. 29, 2017

Related U.S. Application Data

(60) Provisional application No. 62/271,954, filed on Dec. 28, 2015.

(51) Int. Cl.
  *H03L 7/099* (2006.01)
  *H04L 27/26* (2006.01)
  *H03L 7/197* (2006.01)

(52) U.S. Cl.
  CPC ............ *H04L 27/261* (2013.01); *H03L 7/099* (2013.01); *H03L 7/1976* (2013.01)

(58) Field of Classification Search
  CPC ... H03L 7/1976; H03L 7/093; H03L 2207/50; H03L 7/087; H03L 7/18; H03L 7/1974

USPC ................. 375/327, 350, 354–355, 371–377
See application file for complete search history.

(56) References Cited

U.S. PATENT DOCUMENTS

| | | | | |
|---|---|---|---|---|
| 6,873,213 B2* | 3/2005 | Tsuda | .................... | H03L 7/1976 331/1 A |
| 7,274,231 B1* | 9/2007 | Gillespie | .................. | H03L 7/06 327/156 |
| 7,911,241 B1* | 3/2011 | Zeller | .................... | H03L 7/1976 327/105 |
| 8,866,519 B1* | 10/2014 | Hiebert | ................. | H03L 7/1976 327/147 |
| 9,041,444 B1* | 5/2015 | Tarighat Mehrabani | . | H03L 7/00 327/157 |

(Continued)

*Primary Examiner* — Emmanuel Bayard
(74) *Attorney, Agent, or Firm* — John R. Pessetto; Charles A. Brill; Frank D. Cimino

(57) ABSTRACT

The disclosure provides a frequency synthesizer. It includes a PFD that generates an up signal and a down signal in response to a reference signal and a feedback signal. A charge pump generates a control voltage in response to the up signal and the down signal. A low pass filter generates a filtered voltage in response to the control voltage. An oscillator circuit generates an output signal in response to the filtered voltage. A feedback divider is coupled between the oscillator circuit and the PFD, and divides the output signal by a first integer divider to generate the feedback signal. A sigma delta modulator (SDM) generates a second integer divider in response to the feedback signal, the reference signal, the output signal and the first integer divider. A digital filter is coupled between the SDM and the feedback divider, and filters quantization noise associated with the SDM.

20 Claims, 6 Drawing Sheets

(56) References Cited

U.S. PATENT DOCUMENTS

| | | | |
|---|---|---|---|
| 9,705,521 B1* | 7/2017 | Monk | H03M 1/08 |
| 2004/0232995 A1* | 11/2004 | Thomsen | H03L 1/022 |
| | | | 331/2 |
| 2005/0216780 A1* | 9/2005 | Sung | G06F 1/04 |
| | | | 713/500 |
| 2006/0133517 A1* | 6/2006 | Ko | H03M 7/3015 |
| | | | 375/247 |
| 2006/0164132 A1* | 7/2006 | Martin | H03L 7/081 |
| | | | 327/105 |
| 2008/0164917 A1* | 7/2008 | Floyd | H03L 7/1974 |
| | | | 327/117 |
| 2010/0207693 A1* | 8/2010 | Fagg | H03L 7/185 |
| | | | 331/10 |
| 2010/0225361 A1* | 9/2010 | Rhee | H03K 23/507 |
| | | | 327/105 |
| 2013/0070881 A1* | 3/2013 | Lin | H03L 7/099 |
| | | | 375/362 |
| 2013/0229954 A1* | 9/2013 | Narathong | H04B 1/408 |
| | | | 370/280 |
| 2014/0077843 A1* | 3/2014 | Kennedy | H03L 7/193 |
| | | | 327/105 |
| 2015/0145567 A1* | 5/2015 | Perrott | H03L 7/093 |
| | | | 327/156 |
| 2016/0248431 A1* | 8/2016 | Luo | G06F 1/04 |

\* cited by examiner

PHASE NOISE IMPROVEMENT TECHNIQUES FOR WIDEBAND FRACTIONAL-N SYNTHESIZERS

CROSS REFERENCE TO RELATED APPLICATIONS

This application claims priority from U.S. provisional patent application No. 62/271,954 filed on Dec. 28, 2015 which is hereby incorporated by reference in its entirety.

TECHNICAL FIELD

The present disclosure is generally related to fractional-N synthesizer, and more particularly to improvising phase noise in fractional-N synthesizer.

BACKGROUND

Phase locked loop (PLL) is often used to implement frequency synthesizers in various wireless communication systems. A frequency synthesizer is an electronic system that translates an input signal at a reference frequency to an output signal at a different frequency. The various specifications of a frequency synthesizer such as output frequency range, stability, bandwidth, noise, speed and power characterize a design of the frequency synthesizer.

The performance of an integer-N frequency synthesizer can be reasonably predicted with good accuracy and it is simple to design. However, the integer-N frequency synthesizer has some limitations. For stable operation, the PLL loop bandwidth is constrained by the reference frequency, which is defined by frequency resolution of a wireless communication system. Such narrow bandwidth requirement translates into slower loop settling behavior and less suppression of VCO phase noise. This limits the usefulness of the integer-N frequency synthesizer. Hence, the focus of industry changed to fractional-N synthesizers which allow a wide loop bandwidth and achieve fine frequency resolution simultaneously. In addition, a fractional-N synthesizer can support range of reference frequencies.

However, fractional-N synthesizers suffer from multiple drawbacks such as: (a) performance degradation due to quantization noise of a sigma delta modulator used in the fractional-N synthesizers; (b) noise of charge pump is a major phase noise contributor in low power implementations; and/or (c) variation in bandwidth causes noise to degrade.

The existing solutions to address these drawbacks include use of a highly linear charge pump. But this leads to increased current and noise due to additional hardware. Another solution is to use linearization techniques such as offset PFD (phase/frequency detector), dual PFD and gated offset PFD. These techniques have several disadvantages such as increased reference spur, and additional complexity to generate accurate timing.

SUMMARY

The disclosure provides a frequency synthesizer. It includes a PFD that generates an up signal and a down signal in response to a reference signal and a feedback signal. A charge pump generates a control voltage in response to the up signal and the down signal. A low pass filter generates a filtered voltage in response to the control voltage. An oscillator circuit generates an output signal in response to the filtered voltage. A feedback divider is coupled between the oscillator circuit and the PFD, and divides the output signal by a first integer divider to generate the feedback signal. A sigma delta modulator (SDM) generates a second integer divider in response to the feedback signal, the reference signal, the output signal and the first integer divider. A digital filter is coupled between the SDM and the feedback divider, and filters quantization noise associated with the SDM.

BRIEF DESCRIPTION OF THE VIEWS OF DRAWINGS

DETAILED DESCRIPTION OF THE EMBODIMENTS

Figure 1:
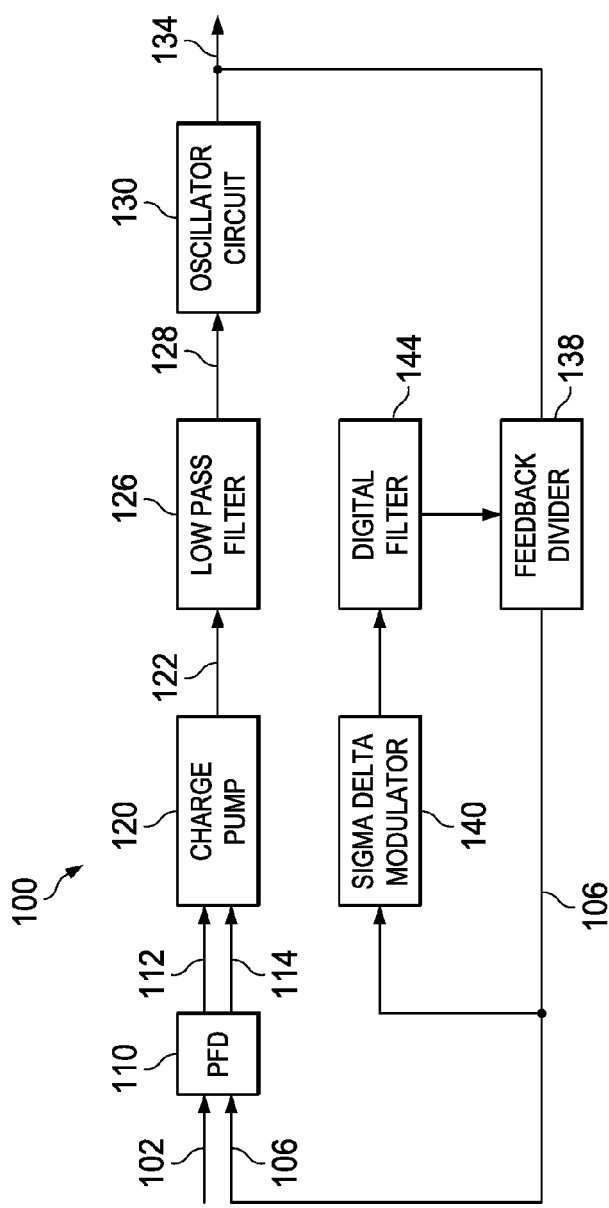
FIG. 1 illustrates a frequency synthesizer, according to an embodiment.

FIG. 1 illustrates a frequency synthesizer 100, according to an embodiment. The frequency synthesizer 100 includes a phase/frequency detector (PFD) 110, a charge pump 120, a low pass filter 126, an oscillator circuit 130, a feedback divider 138, a sigma delta modulator 140 and a digital filter 144. The PFD 110 receives a reference signal 102 and a feedback signal 106. The charge pump 120 is coupled to the PFD 110. The low pass filter 126 is coupled to the charge pump 120.

The oscillator circuit 130 is coupled to the low pass filter 126. The feedback divider 138 is coupled between the oscillator circuit 130 and the PFD 110. The sigma delta modulator 140 is coupled to the feedback divider 138, and the digital filter 144 is coupled between the sigma delta modulator 140 and the feedback divider 138. The frequency synthesizer 100 may include one or more additional components known to those skilled in the relevant art and are not discussed here for simplicity of the description.

The operation of the frequency synthesizer 100 is explained now. The PFD 110 compares the reference signal 102 and the feedback signal 106 to generate an up signal 112 and a down signal 114. The PFD 110 detects a phase difference and a frequency difference between the reference signal 102 and the feedback signal 106.

The charge pump 120 generates a control voltage 122 in response to the up signal 112 and the down signal 114. The low pass filter 126 filters the control voltage 122 to generate a filtered voltage 128. The oscillator circuit 130 generates an output signal 134 in response to the filtered voltage 128.

When the frequency synthesizer 100 is initiated, a value of the reference signal 102 and a value of the output signal 134 are predefined by a user. Correspondingly, a first integer divider is stored in the feedback divider 138 and the sigma delta modulator 140. The sigma delta modulator 140 also stores the value of the reference signal 102 and the value of the output signal 134.

In one example, when the frequency synthesizer 100 is used for wideband applications, the first integer divider varies by a factor of 2 which increases a loop bandwidth of the frequency synthesizer 100. This increases the noise contribution by the charge pump 120 and the sigma delta modulator 140 to the output signal 134.

Also, phase noise contributed by the oscillator circuit 130 increases when the loop bandwidth of the frequency synthesizer 100 is decreased. The following step is used to maintain the performance of the frequency synthesizer 100. The loop bandwidth of the frequency synthesizer 100 is proportional to the value of the first integer divider.

The charge pump 120 is driven by a programmed current. The programmed current is fixed based on a value of the first integer divider. When the value of the first integer divider is increased, the programmed current to the charge pump 120 is decreased proportionately. This ensures that the frequency synthesizer 100 operates at an optimum bandwidth for the best performance of the frequency synthesizer 100.

The feedback divider 138 divides the output signal 134 by the first integer divider to generate the feedback signal 106. The sigma delta modulator 140 generates a second integer divider in response to the feedback signal 106, the reference signal 102, the output signal 134 and the first integer divider.

The digital filter 144 filters the quantization noise associated with the sigma delta modulator 140. The digital filter 144 filters high frequency quantization noise associated with the sigma delta modulator 140. This decreases a foldback noise associated with the charge pump 120 by a first predefined factor. Because of non-linearity of the charge pump 120, the sigma delta modulator 140 introduces the foldback noise in the control voltage 122 generated by the charge pump 120. This foldback noise is not filtered by the low pass filter 126, and hence corrupts the output signal 134. The foldback noise is decreased by the use of digital filter 144. The first predefined factor is dependent on filter coefficients associated with the digital filter 144 and the first integer divider.

The digital filter 144 provides the second integer divider to the feedback divider 138. The frequency synthesizer 100 operates in a plurality of cycles to equalize the phase difference and the frequency difference between the reference signal 102 and the feedback signal 106. The feedback divider 138 divides the output signal 134 by the first integer divider in a first cycle. The feedback divider 138 divides the output signal 134 by the second integer divider in a second cycle. The first cycle and the second cycle are consecutive cycles of the plurality of cycles. At the end of the plurality of cycles, the second integer divider is a factor of ratio of output signal 134 and the reference signal 102.

The frequency synthesizer 100 provides improved performance as compared to conventional frequency synthesizers. This is because the non-linearity of the charge pump 120 is addressed by the use of digital filter 144. The non-linearity of the charge pump 120 degrades the in-band noise of the frequency synthesizer 100 and adds fractional spurs. The digital filter 144 is effective to reduce the noise associated with the charge pump 120.

Figure 2:
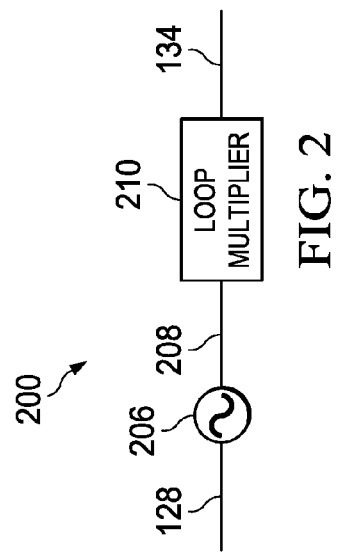
FIG. 2 illustrates an oscillator circuit, according to an embodiment.

FIG. 2 illustrates an oscillator circuit 200, according to an embodiment. The oscillator circuit 200 is similar in connection and operation to the oscillator circuit 130 illustrated in FIG. 1. The oscillator circuit 200 includes a voltage controlled oscillator (VCO) 206 and a loop multiplier 210. The loop multiplier 210 is coupled to the VCO 206. The operation of the oscillator circuit 200 is explained in connection with the frequency synthesizer 100 illustrated in FIG. 1.

The VCO 206 receives the filtered voltage 128 from the low pass filter 126 and generates a first signal 208. The loop multiplier 210 multiplies the first signal 208 by a multiplying coefficient to generate the output signal 134. A feedback loop of the frequency synthesizer 100 is formed by the oscillator circuit 130, the feedback divider 138 and the PFD 110. Thus, the loop multiplier 210 is within the feedback loop of the frequency synthesizer 100. This ensures that the first integer divider stored in the feedback divider 138 and the sigma delta modulator 140 is of higher value. It also warrants that the second integer divider generated by the sigma delta modulator 140 is of higher value (as compared to the case without the loop multiplier 210) such that the noise associated with the sigma delta modulator 140 is reduced.

The loop multiplier 210 increases an over sampling rate of the sigma delta modulator 140 by a factor equivalent of the multiplying coefficient. In addition, a timing of the up signal 112 and the down signal 114 are decreased by a factor equivalent to the multiplying coefficient. This reduces the on time of the charge pump 120 by a second predefined factor which in turn reduces the noise associated with the charge pump 120.

The second predefined factor is dependent on the noise associated with the charge pump 120 when the loop multiplier 210 is not used in the oscillator circuit 200. Thus, the oscillator circuit 200 improves the performance of the frequency synthesizer 100. Because of non-linearity of the charge pump 120, the quantization noise of the sigma delta modulator 140 introduces a foldback noise in the control voltage 122 generated by the charge pump 120. The loop multiplier 210 increases the over sampling rate of the sigma delta modulator 140 which reduces the quantization noise of the sigma delta modulator 140. This results in decrease in the foldback noise introduced in the control voltage 122. Thus, apart from the digital filter 144, the loop multiplier 210 also reduces the foldback noise in the control voltage 122.

Figure 3:
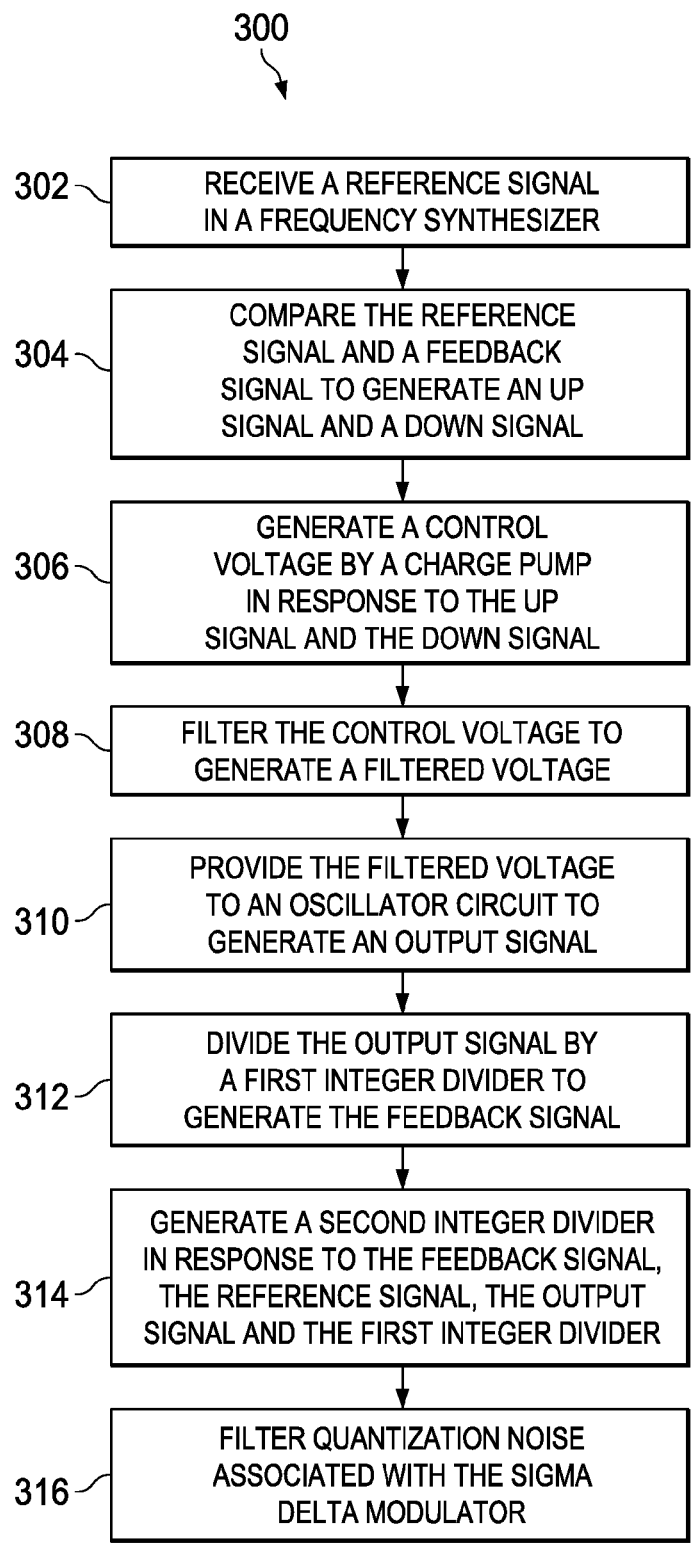
FIG. 3 is a flowchart to illustrate a method of operation of a frequency synthesizer, according to an embodiment.

FIG. 3 is a flowchart to illustrate a method 300 of operation of a frequency synthesizer, according to an embodiment. The flowchart is explained in connection with the frequency synthesizer 100 illustrated in FIG. 1. At step 302, a reference signal is received by a frequency synthesizer. In FIG. 1, the frequency synthesizer 100 receives the reference signal 102. The reference signal is compared with a feedback signal to generate an up signal and a down signal, at step 304.

In frequency synthesizer 100, the phase/frequency detector (PFD) 110 receives the reference signal 102 and the feedback signal 106. The PFD 110 compares the reference signal 102 and the feedback signal 106 to generate the up signal 112 and the down signal 114. The PFD 110 detects a phase difference and a frequency difference between the reference signal 102 and the feedback signal 106.

At step 306, a control voltage is generated by a charge pump in response to the up signal and the down signal. The control voltage is filtered to generate a filtered voltage at step 308. The filtered voltage is provided to an oscillator circuit to generate an output signal, at step 310.

In frequency synthesizer 100, the charge pump 120 generates the control voltage 122 in response to the up signal 112 and the down signal 114. The low pass filter 126 filters the control voltage 122 to generate the filtered voltage 128. The oscillator circuit 130 generates the output signal 134 in response to the filtered voltage 128.

At step 312, the output signal is divided by a first integer divider to generate the feedback signal. When the frequency synthesizer 100 is initiated, a value of the reference signal 102 and the output signal 134 are predefined by a user. Correspondingly, a first integer divider is computed based on the value of the reference signal 102 and the output signal 134. The feedback divider 138 divides the output signal 134 by the first integer divider to generate the feedback signal 106.

At step 314, a second integer divider is generated in response to the feedback signal, the reference signal, the output signal and the first integer divider. The quantization noise associated with the sigma delta modulator is filtered at step 316. The sigma delta modulator 140 generates a second integer divider in response to the feedback signal 106, the reference signal 102, the output signal 134 and the first integer divider.

The digital filter 144 filters the quantization noise associated with the sigma delta modulator 140. The digital filter 144 filters high frequency quantization noise associated with the sigma delta modulator 140. This decreases a foldback noise associated with the charge pump 120 by a first predefined factor. Because of non-linearity of the charge pump 120, the sigma delta modulator 140 introduces foldback noise in the control voltage 122 generated by the charge pump 120. This foldback noise is not filtered by the low pass filter 126, and hence corrupts the output signal 134. The foldback noise is decreased by the use of digital filter 144. The first predefined factor is dependent on filter coefficients associated with the digital filter 144 and the first integer divider.

The digital filter 144 provides the second integer divider to the feedback divider 138. The frequency synthesizer operates in a plurality of cycles to equalize the phase difference and the frequency difference between the reference signal and the feedback signal. The feedback divider divides the output signal by the first integer divider in a first cycle. The feedback divider divides the output signal by the second integer divider in a second cycle. The first cycle and the second cycle are consecutive cycles of the plurality of cycles.

The step 308 of filtering the control voltage further includes providing the filtered voltage to a VCO to generate a first signal, and multiplying the first signal by a multiplying coefficient to generate the output signal. This ensures that the first integer divider stored in the feedback divider 138 and the sigma delta modulator 140 is of higher value. It also warrants that the second integer divider generated by the sigma delta modulator 140 is of higher value (as compared to the case without the loop multiplier 210) such that the noise associated with the sigma delta modulator 140 is reduced.

An over sampling rate of the sigma delta modulator is increased by a factor equivalent to the multiplying coefficient. In addition, a timing of the up signal and the down signal are decreased by a factor equivalent to the multiplying coefficient such that an on time of the charge pump is reduced by a second predefined factor which in turn reduces the noise associated with the charge pump.

The method 300 when used in a frequency synthesizer provides improved performance as compared to conventional frequency synthesizers. This is because the non-linearity of the charge pump is addressed by the use of digital filter for example the digital filter 144. The non-linearity of the charge pump degrades the in-band noise of the frequency synthesizer and adds fractional spurs. The digital filter is effective to reduce the noise associated with the charge pump.

Figure 4:
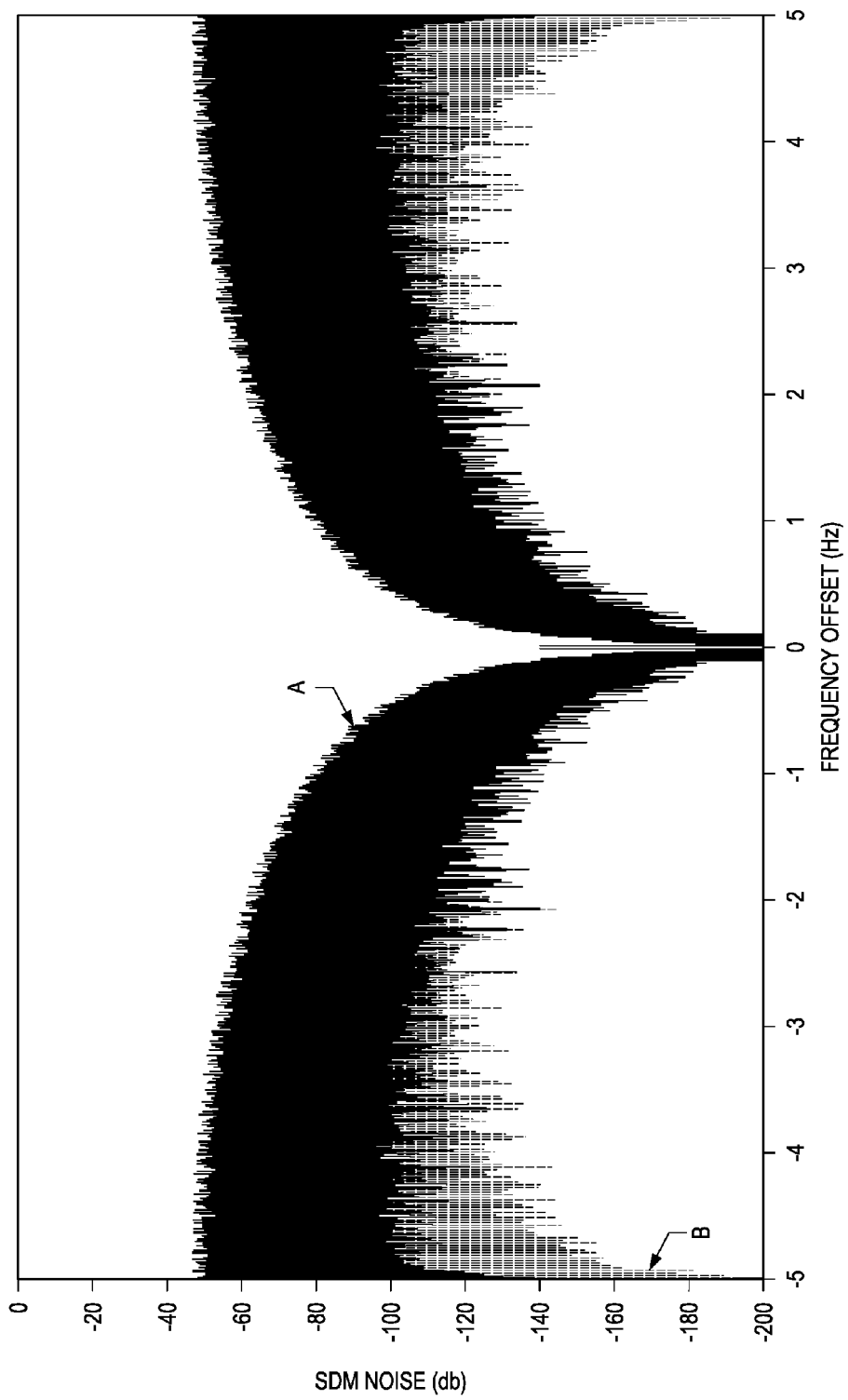
FIG. 4 is a graph to illustrate quantization noise associated with a sigma delta modulator, according to an embodiment.

FIG. 4 is a graph to illustrate quantization noise associated with a sigma delta modulator, according to an embodiment. The graph is explained in connection with the sigma delta modulator 140 illustrated in FIG. 1. Graph A illustrates quantization noise associated with the sigma delta modulator 140 when the digital filter 144 is not used in the frequency synthesizer 100. Graph B illustrates quantization noise associated with the sigma delta modulator 140 when the digital filter 144 is used in the frequency synthesizer 100. Thus, the quantization noise associated with the sigma delta modulator 140 is reduced with the use of the digital filter 144.

The sigma delta modulator 140 generates a second integer divider in response to the feedback signal 106, the reference signal 102, the output signal 134 and the first integer divider. The digital filter 144 filters the quantization noise associated with the sigma delta modulator 140. The digital filter 144 filters high frequency quantization noise associated with the sigma delta modulator 140 as illustrated by Graph B. The filtering of quantization noise associated with the sigma delta modulator 140 by the digital filter 144 ensures that the foldback noise in the control voltage 122 generated by the charge pump 120 is decreased. Thus, the non-linearity of the charge pump 120 is addressed by the use of digital filter 144.

Figure 5:
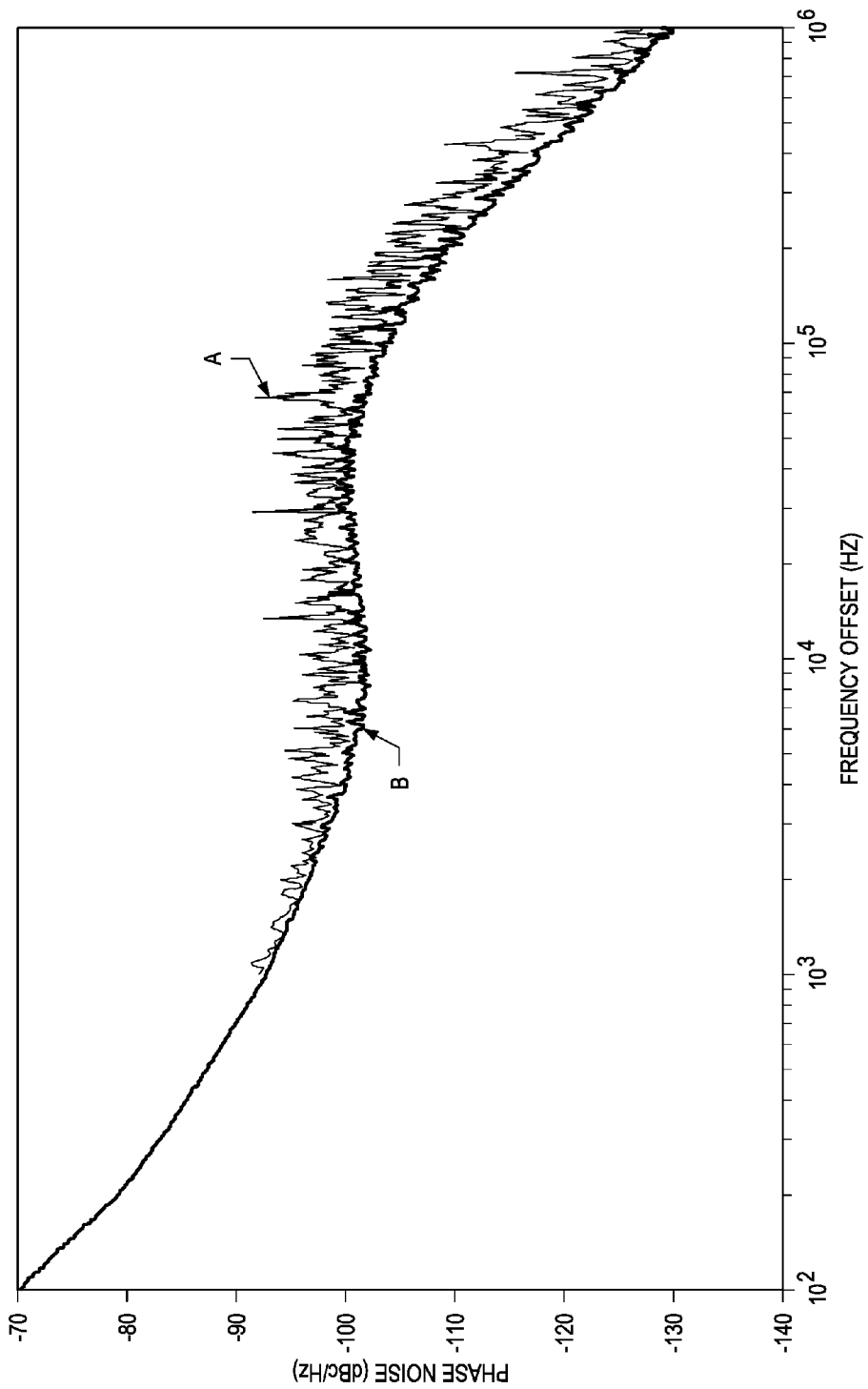
FIG. 5 is a graph to illustrate phase noise associated with a frequency synthesizer, according to an embodiment.

FIG. 5 is a graph to illustrate phase noise associated with a frequency synthesizer, according to an embodiment. The graph is explained in connection with the frequency synthesizer 100 illustrated in FIG. 1. Graph A illustrates the phase noise associated with the frequency synthesizer 100 when the digital filter 144 is not used in the frequency synthesizer 100. Graph B illustrates the phase noise associated with the frequency synthesizer 100 when the digital filter 144 is used in the frequency synthesizer 100. Thus, the phase noise associated with the frequency synthesizer 100 is reduced with the use of the digital filter 144.

The digital filter 144 filters quantization noise associated with the sigma delta modulator 140. This reduces the foldback noise in the control voltage 122 generated by the charge pump 120. Thus, the non-linearity of the charge pump 120 is addressed by the use of the digital filter 144 which improves the phase noise of the frequency synthesizer 100.

Figure 6:
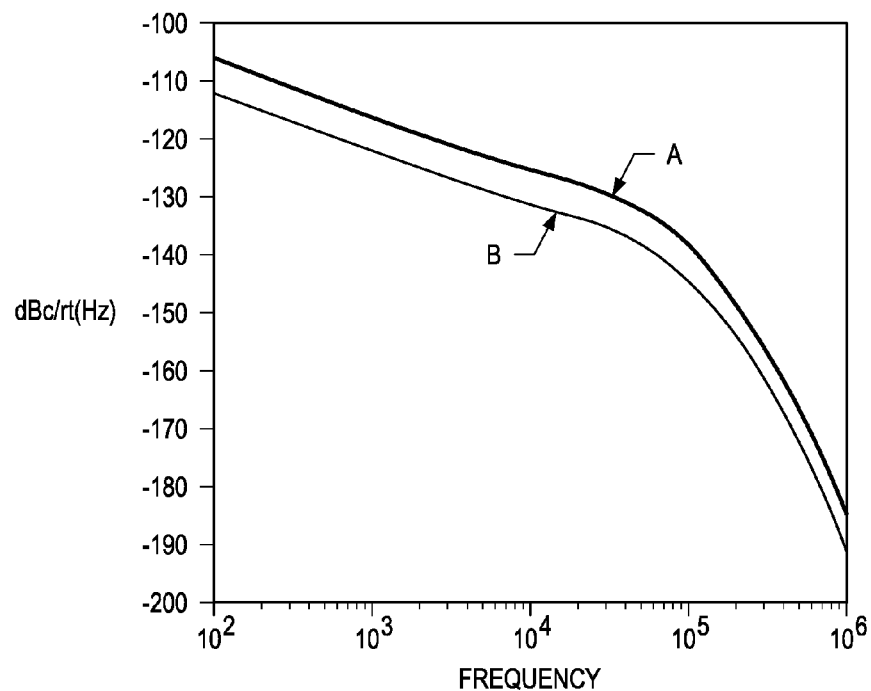
FIG. 6 is a graph to illustrate noise associated with a charge pump, according to an embodiment.

FIG. 6 is a graph to illustrate noise associated with a charge pump, according to an embodiment. The graph is explained in connection with the frequency synthesizer 100 illustrated in FIG. 1. Graph A illustrates the noise associated with the charge pump 120 when the loop multiplier 210 is not used in the frequency synthesizer 100. Graph B illustrates the noise associated with the charge pump 120 when the loop multiplier 210 is used in the frequency synthesizer 100. Thus, the noise associated with the charge pump 120 is reduced with the use of the loop multiplier 210.

The loop multiplier 210 increases an over sampling rate of the sigma delta modulator 140 by a factor equivalent of the multiplying coefficient. In addition, a timing of the up signal 112 and the down signal 114 are decreased by a factor equivalent to the multiplying coefficient. This reduces the on time of the charge pump 120 by a second predefined factor which in turn reduces the noise associated with the charge pump 120 (as illustrated by Graph B). The second predefined factor is dependent on the noise associated with the charge pump 120 when the loop multiplier 210 is not used in the oscillator circuit 200. Thus, the loop multiplier 210 improves the performance of the frequency synthesizer 100.

Figure 7:
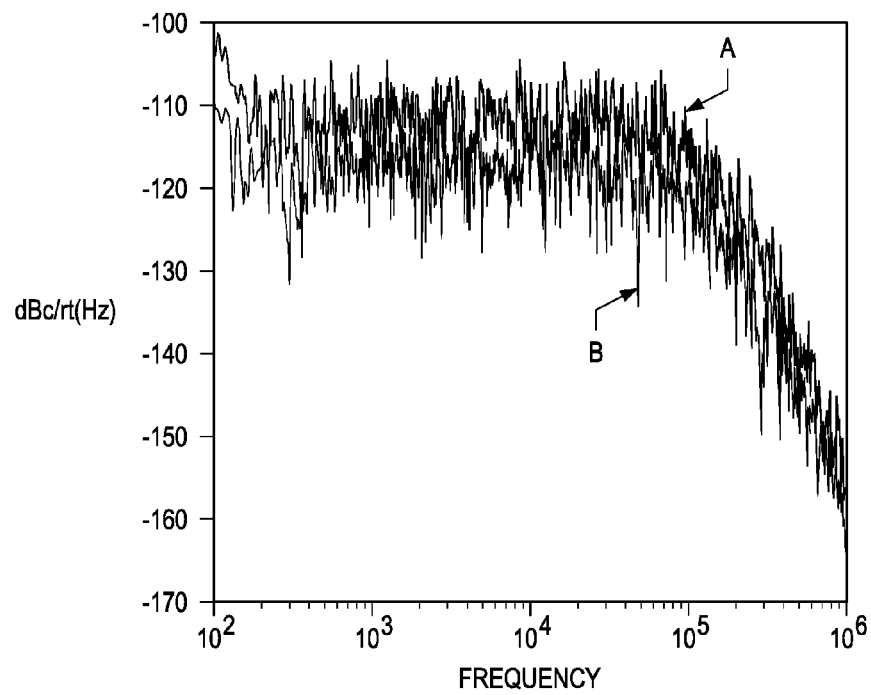
FIG. 7 is a graph to illustrate noise associated with a sigma delta modulator, according to an embodiment.

FIG. 7 is a graph to illustrate noise associated with a sigma delta modulator, according to an embodiment. The graph is explained in connection with the frequency synthesizer 100 illustrated in FIG. 1. Graph A illustrates the noise associated with the sigma delta modulator 140 when the loop multiplier 210 is not used in the frequency synthesizer 100. Graph B illustrates the noise associated with the sigma delta modulator 140 when the loop multiplier 210 is used in the frequency synthesizer 100. Thus, the noise associated with the sigma delta modulator 140 is reduced with the use of the loop multiplier 210.

The loop multiplier 210 is within a feedback loop of the frequency synthesizer 100. A feedback loop of the frequency synthesizer 100 is formed by the oscillator circuit 130, the feedback divider 138 and the PFD 110. This ensures that the first integer divider stored in the feedback divider 138 and the sigma delta modulator 140 is of higher value. It also warrants that the second integer divider generated by the sigma delta modulator 140 is of higher value (as compared to the case without the loop multiplier 210) such that the noise associated with the sigma delta modulator 140 is reduced. Thus, the use of loop multiplier 210 reduces the noise associated with the sigma delta modulator 140, and improves the performance of the frequency synthesizer 100.

Figure 8:
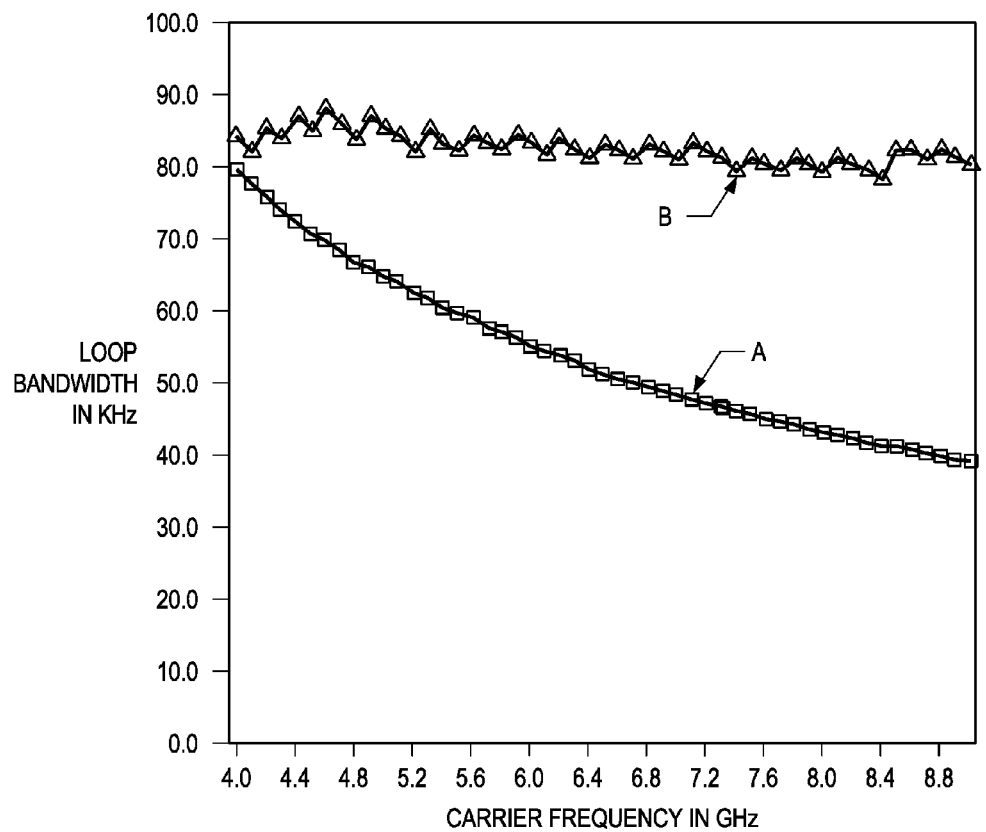
FIG. 8 is a graph to illustrate loop bandwidth of a frequency synthesizer, according to an embodiment.

FIG. 8 is a graph to illustrate loop bandwidth of a frequency synthesizer, according to an embodiment. The graph is explained in connection with the frequency synthesizer 100 illustrated in FIG. 1. The graph illustrates loop bandwidth with respect to a frequency of the output signal 134. Graph A illustrates the loop bandwidth when a programmed current to the charge pump 120 is not altered with increase in the frequency of the output signal 134. Graph B illustrates the loop bandwidth when the programmed current to the charge pump 120 is altered with increase in the frequency of the output signal 134. Thus, the loop bandwidth is maintained (Graph B) when the programmed current to the charge pump 120 is altered with increase in the frequency of the output signal 134.

In one example, when the frequency synthesizer 100 is used for wideband applications, the first integer divider varies by a factor of 2 which increases a loop bandwidth of the frequency synthesizer 100. This increases the noise contribution by the charge pump 120 and the sigma delta modulator 140 to the output signal 134.

Also, phase noise contributed by the oscillator circuit 130 increases when the loop bandwidth of the frequency synthesizer 100 is decreased. The following step is used to maintain the performance of the frequency synthesizer 100. The loop bandwidth of the frequency synthesizer 100 is proportional to the value of the first integer divider.

The charge pump 120 is driven by a programmed current. The programmed current is fixed based on a value of the first integer divider. As the frequency of the output signal 134 increases, the value of the first integer divider increases.

When the value of the first integer divider is increased, the programmed current to the charge pump 120 is decreased proportionately. This ensures that the frequency synthesizer 100 operates at an optimum bandwidth for the best performance of the frequency synthesizer 100 (as illustrated by Graph B)

Figure 9:
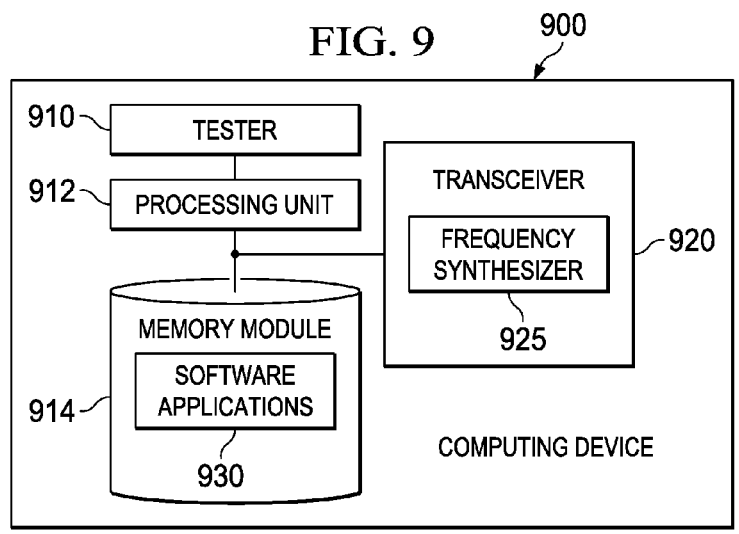
FIG. 9 illustrates a computing device, according to an embodiment.

FIG. 9 illustrates a computing device 900, according to an embodiment. The computing device 900 is, or is incorporated into, a mobile communication device, such as a mobile phone, a personal digital assistant, a transceiver, a personal computer, or any other type of electronic system. The computing device 900 may include one or more additional components known to those skilled in the relevant art and are not discussed here for simplicity of the description.

In some embodiments, the computing device 900 comprises a megacell or a system-on-chip (SoC) which includes a processing unit 912 such as a CPU (Central Processing Unit), a memory module 914 (e.g., random access memory (RAM)) and a tester 910. The processing unit 912 can be, for example, a CISC-type (Complex Instruction Set Computer) CPU, RISC-type CPU (Reduced Instruction Set Computer), or a digital signal processor (DSP).

The memory module 914 (which can be memory such as RAM, flash memory, or disk storage) stores one or more software applications 930 (e.g., embedded applications) that, when executed by the processing unit 912, performs any suitable function associated with the computing device 900. The tester 910 comprises logic that supports testing and debugging of the computing device 900 executing the software applications 930.

For example, the tester 910 can be used to emulate a defective or unavailable component(s) of the computing device 900 to allow verification of how the component(s), were it actually present on the computing device 900, would perform in various situations (e.g., how the component(s) would interact with the software applications 930). In this way, the software applications 930 can be debugged in an environment which resembles post-production operation.

The processing unit 912 typically comprises memory and logic which store information frequently accessed from the memory module 914. The computing device 900 includes a transceiver 920. The transceiver 920 includes a frequency synthesizer 925. The frequency synthesizer 925 is similar in connection and operation to the frequency synthesizer 100 illustrated in FIG. 1. The frequency synthesizer 925 includes a phase/frequency detector (PFD), a charge pump, a low pass filter, an oscillator circuit, a feedback divider, a sigma delta modulator and a digital filter similar to the frequency synthesizer 100.

The frequency synthesizer 925 provides improved performance as compared to conventional frequency synthesizers. This is because the non-linearity of the charge pump is addressed by the use of digital filter. The non-linearity of the charge pump degrades the in-band noise of the frequency synthesizer 925 and adds fractional spurs. The digital filter is effective to reduce the noise associated with the charge pump. In addition, a loop multiplier used in the oscillator circuit reduces the noise associated with the sigma delta modulator, and improves the performance of the frequency synthesizer 925.

Modifications are possible in the described embodiments, and other embodiments are possible, within the scope of the claims.

What is claimed is:
1. A frequency synthesizer comprising:
   a phase/frequency detector (PFD) configured to receive a reference signal and a feedback signal, and configured to generate an up signal and a down signal in response to the reference signal and the feedback signal;
   a charge pump coupled to the PFD and configured to generate a control voltage in response to the up signal and the down signal;
   a low pass filter coupled to the charge pump and configured to generate a filtered voltage in response to the control voltage;
   an oscillator circuit coupled to the low pass filter, and configured to generate an output signal in response to the filtered voltage;

a feedback divider coupled between the oscillator circuit and the PFD, and configured to divide the output signal by a first integer divider to generate the feedback signal;

a sigma delta modulator coupled to the feedback divider, and configured to generate a second integer divider in response to the feedback signal, the reference signal, the output signal and the first integer divider; and a digital filter coupled between the sigma delta modulator and the feedback divider, the digital filter configured to filter quantization noise associated with the sigma delta modulator.

2. The frequency synthesizer of claim 1, wherein the second integer divider is provided to the feedback divider.

3. The frequency synthesizer of claim 1 configured to operate in a plurality of cycles to equalize a phase difference and a frequency difference of the reference signal and the feedback signal.

4. The frequency synthesizer of claim 3, wherein the feedback divider is configured to divide the output signal by the first integer divider in a first cycle, and the feedback divider is configured to divide the output signal by the second integer divider in a second cycle, wherein the first cycle and the second cycle are consecutive cycles of the plurality of cycles.

5. The frequency synthesizer of claim 1, wherein the digital filter is further configured to filter high frequency quantization noise associated with the sigma delta modulator such that a foldback noise associated with charge pump is decreased by a first predefined factor.

6. The frequency synthesizer of claim 1, wherein the oscillator circuit further comprises:

a voltage controlled oscillator (VCO) configured to receive the filtered voltage and generate a first signal; and a loop multiplier coupled to the VCO and configured to multiply the first signal by a multiplying coefficient to generate the output signal.

7. The frequency synthesizer of claim 6, wherein the loop multiplier is configured to increase an over sampling rate of the sigma delta modulator by a factor equivalent to the multiplying coefficient.

8. The frequency synthesizer of claim 6, wherein a timing of the up signal and the down signal are decreased by a factor equivalent to the multiplying coefficient such that an on time of the charge pump is reduced by a second predefined factor.

9. The frequency synthesizer of claim 1, wherein the charge pump is driven by a programmed current, and the programmed current is fixed based on a value of the first integer divider.

10. The frequency synthesizer of claim 9, wherein when the value of the first integer divider is increased, the programmed current to the charge pump is decreased proportionately.

11. A method comprising:

receiving a reference signal in a frequency synthesizer;

comparing the reference signal and a feedback signal to generate an up signal and a down signal;

generating a control voltage by a charge pump in response to the up signal and the down signal;

filtering the control voltage to generate a filtered voltage;

providing the filtered voltage to an oscillator circuit to generate an output signal;

dividing the output signal by a first integer divider to generate the feedback signal;

generating a second integer divider by a sigma delta modulator in response to the feedback signal, the reference signal, the output signal and the first integer divider; and filtering quantization noise associated with the sigma delta modulator.

12. The method of claim 11 further comprising operating the frequency synthesizer in a plurality of cycles to equalize a phase and a frequency of the reference signal and the feedback signal.

13. The method of claim 12 further comprising:

dividing the output signal by the first integer divider in a first cycle; and dividing the output signal by the second integer divider in a second cycle, wherein the first cycle and the second cycle are consecutive cycles of the plurality of cycles.

14. The method of claim 11, wherein filtering quantization noise further comprises filtering high frequency quantization noise associated with the sigma delta modulator by a digital filter such that a foldback noise associated with the charge pump is decreased by a first predefined factor.

15. The method of claim 11, wherein providing the filtered voltage to the oscillator circuit further comprises:

providing the filtered voltage to a voltage controlled oscillator (VCO) to generate a first signal; and multiplying the first signal by a multiplying coefficient to generate the output signal.

16. The method of claim 15 further comprising increasing an over sampling rate of the sigma delta modulator by a factor equivalent to the multiplying coefficient.

17. The method of claim 15 further comprising decreasing a timing of the up signal and the down signal by a factor equivalent to the multiplying coefficient such that an on time of the charge pump is reduced by a second predefined factor.

18. The method of claim 11 further comprising driving the charge pump by a programmed current, and the programmed current is fixed based on a value of the first integer divider.

19. The method of claim 18 further comprising decreasing proportionately the programmed current to the charge pump when the value of the first integer divider is increased.

20. A computing device comprising:

a processing unit;

a memory module coupled to the processing unit; and a transceiver coupled to the processing unit and the memory module, the transceiver includes a frequency synthesizer, the frequency synthesizer further comprising:

a phase/frequency detector (PFD) configured to receive a reference signal and a feedback signal, and configured to generate an up signal and a down signal in response to the reference signal and the feedback signal;

a charge pump coupled to the PFD and configured to generate a control voltage in response to the up signal and the down signal;

a low pass filter coupled to the charge pump and configured to generate a filtered voltage in response to the control voltage;

an oscillator circuit coupled to the low pass filter, and configured to generate an output signal in response to the filtered voltage;

a feedback divider coupled between the oscillator circuit and the PFD, and configured to divide the output signal by a first integer divider to generate the feedback signal;

a sigma delta modulator coupled to the feedback divider, and configured to generate a second integer divider in response to the feedback signal, the reference signal, the output signal and the first integer divider; and a digital filter coupled between the sigma delta modulator and the feedback divider, the digital filter configured to filter a quantization noise associated with the sigma delta modulator.

\* \* \* \* \*